United States Patent [19]

Suzuki

[11] Patent Number: 4,837,765
[45] Date of Patent: Jun. 6, 1989

[54] TEST CONTROL CIRCUIT FOR INTEGRATED CIRCUIT

[75] Inventor: Takamasa Suzuki, Tokyo, Japan

[73] Assignee: NEC Corporation, Tokyo, Japan

[21] Appl. No.: 71,068

[22] Filed: Jul. 8, 1987

[30] Foreign Application Priority Data

Jul. 11, 1986 [JP] Japan .................................. 61-163040

[51] Int. Cl.$^4$ .............................................. G06F 11/00
[52] U.S. Cl. ......................................... 371/25; 371/15
[58] Field of Search ...................... 371/25, 20, 15, 68, 371/36; 324/73 R, 73 AT

[56] References Cited

U.S. PATENT DOCUMENTS 4,241,307 12/1980 Hong ................................. 371/25 X
4,503,537 3/1985 McAnney ............................. 371/25
4,597,042 6/1986 d'Angeac ........................... 371/25 X Primary Examiner—Jerry Smith
Assistant Examiner—Robert W. Beausoliel
Attorney, Agent, or Firm—Sughrue, Mion, Zinn, Macpeak & Seas

[57] ABSTRACT

For shortening the time period needed for test of component function blocks fabricated on a semiconductor chip and detecting a circuit trouble, there is disclosed a test control circuit for an integrated circuit having a plurality of component blocks including at least two component blocks responsive to respective data signals or a common test signal and achieving predetermined functions, respectively, to produce respective output signals based on the respective data signals or the common test signal, the predetermined functions being identical with one another, comprising (a) a control signal generating circuit responsive to a command signal and capable of producing at least two prohibiting signals applied to the at least two component blocks, respectively (b) a mode selecting circuit responsive to a test mode signal and causing the at least two component blocks to respond to the common test signal, and (c) a logic circuit carrying out a logical operation for the output signals supplied from the at least two component blocks and producing an output signal, wherein each of the at least two component blocks suspends the production of the output signal based on the common test signal in the presence of said prohibiting signal, so that the at least two component blocks are examined in the absence of the prohibiting signal and the logic circuit is examined in the presence of the prohibiting signal.

6 Claims, 4 Drawing Sheets

TEST CONTROL CIRCUIT FOR INTEGRATED CIRCUIT

FIELD OF THE INVENTION

This invention relates to a test control circuit for an integrated circuit and, more particularly, to a test control circuit for testing a plurality of component blocks of an integrated circuit at a single test operation.

BACKGROUND OF THE INVENTION

Growing research and development efforts are being made for high-density semiconductor integrated circuit devices with an emphasis put on a very large-scale integration provided with an increased number of component function blocks which have been fabricated on separate semiconductor chips. A typical example of the very large-scale integration is shown in FIG. 1 and comprises a plurality of component function blocks 1, 2, 3 and 4 fabricated on a single semiconductor chip 5 and electrically connected to a group of signal input pins 6, a group of signal output pins 7 and one another. After fabrication of the very large-scale integration, the component function blocks are tested whether or not each component function block performs an operation expected thereto. For this reason, the very large-scale integration of the type having the component function blocks is provided with a test control circuit and a typical example of the test control circuit is shown in FIG. 2 of the drawings.

Referring to FIG. 2 of the drawings, the prior-art test control circuit is shown together with component function blocks 8, 9 and 10 capable of achieving respective predetermined functions identical with one another. The prior-art test control circuit comprises plural groups of selector circuits associated with the respective component function blocks 8, 9 and 10, but only one selector circuit of each group is illustrated and designated by 11, 12 or 13. The selector circuit 11 has two input nodes one of which is supplied with one data bit of a first external data signal (two data bits of which are labeled $I_{01}$ and $I_{11}$) and the other of which is supplied with one data bit of an external test signal (two bits of which are labeled $I_{21}$ and $I_{22}$). The selector circuit 12 also has two input nodes one of which is supplied with one data bit a second external data signal (two bits of which are labeled $I_{02}$ and $I_{12}$) and other of which is supplied with the data bit $I_{21}$ of the external test signal. Similarly, the selector circuit 13 has two input nodes one of which is supplied with one data bit of a third external data signal (two bits of which are labeled $I_{03}$ and $I_{13}$) and the other of which is supplied with the data bit $I_{21}$ of the external test signal. All of the selector circuits associated with the component function block 8 are responsive to a control signal S1 and transfer either first external data signal or the external test signal to the component function block 8. In the similar manner, the selector circuits associated with the component function blocks 9 and 10 are responsive to the control signal S1 and transfer either second and third external data signals or the external test signal to the component function blocks 9 and 10, respectively. When the component function blocks 8, 9 and 10 are supplied with the first, second and third external data signals, respectively, the component function blocks 8, 9 and 10 carry out the predetermined operations and produce first, second and third output signals S2, S3 and S4 each consisting of a plurality of data bits. The first, second and third output signals S2, S3 and S4 are fed to a selector circuit 14 which is responsive to a control signal S5 and operative to transfer one of the first, second and third output signals S2, S3 and S4 to a group of output terminals 15.

In order to examine the component function blocks, the control signal S1 causes all of the selector circuits to transfer the external test signal to the component function blocks 8, 9 and 10. Then, the component function blocks 8, 9 and 10 achieve the predetermined functions and produce the first, second and third output signals S2, S3 and S4 based on the common external test signal. All of the output signals S2, S3 and S4 are supplied to the selector circuit 14 so that the selector circuit 14 successively transfers the first, second and third output signals S2, S3 and S4 to the output terminals 15 with changing the control signal S5. Then, the component function blocks 8, 9 and 10 are examined by comparing the first, second and third output signals S2, S3 and S4 with an expected value. However, a problem is encountered in the prior-art test control circuit in that a long period of time is needed to achieve the test operation for all of the component function blocks. This is because of the fact that the all of the output signals from the component function blocks are successively read out through the selector circuit 14 even if some of the component function blocks are designed to achieve the predetermined functions identical to one another.

One approach to solve the problem encountered in the prior art test control circuit shown in FIG. 2 is illustrated in FIG. 3 of the drawings together with the component function blocks 21 and 22 achieving respective predetermined functions identical with each other. The test circuit illustrated in FIG. 3 comprises two groups of selector circuits 23 to 28 operative to transfer either first and second external data signals or a common external test signal S6 to the respective component function blocks 21 and 22 depending upon a control signal S7. When either first and second external data signals or the common external test signal S6 are supplied to the component function blocks 21 and 22, the component function blocks 21 and 22 perform the predetermined operations and produce first and second output signals S8 and S9, respectively which are supplied to a group of AND gates 29. Then, the first output signal S8 is ANDed with the second output signal S9 to produce an output signal S10. The component function blocks 21 and 22 are supplied with the common external test signal S6 so that the first output signal S8 is identical in bit string with the second output signal S9 and further to the output signal S10 of the AND gates 29 in so far as the component function blocks 21 and 22 have no trouble. As a result, the component function blocks 21 and 22 are concurrently examined based on the output signal S10. The test control circuit illustrated in FIG. 3 can examine the component function blocks 21 and 22 with the identical functions in a short period of time in comparison with the prior-art test control circuit illustrated in FIG. 2. However, another problem is encountered in the test control circuit illustrated in FIG. 3 in reliability. Namely, if the AND gates 29 have a trouble and produce an output signal S10 identical in bit string to the expected result in spite of difference in bit string between the first and second output signals S8 and S9, the component function blocks would be evaluated to be excellent in quality.

SUMMARY OF THE INVENTION

It is therefore an important object of the present invention to provide a test control circuit operative to examine a plurality of component function blocks at the same time.

It is also an important object of the present invention to provide a test control circuit capable of detecting a circuit trouble thereof.

To accomplish these objects, the present invention proposes to selectively inactivate the component function block which is under test together with the other component function blocks each having the identical function.

In accordance with the present invention, there is provided a test control circuit for an integrated circuit having a plurality of component blocks including at least two component blocks responsive to respective data signals or a common test signal and achieving predetermined functions, respectively, to produce respective output signals based on the respective data signals or the common test signal, the predetermined functions being identical with one another, comprising, (a) a control signal generating circuit responsive to a command signal and capable of producing at least two prohibiting signals applied to the at least two component blocks, respectively, (b) mode selecting means responsive to a test mode signal and causing the at least two component blocks to respond to the common test signal, and (c) a logic circuit carrying out a logical operation for the output signals supplied from the at least two component blocks and producing an output signal, wherein each of the at least two component blocks suspends the production of the output signal based on the common test signal in the presence of the prohibiting signal.

BRIEF DESCRIPTION OF THE DRAWINGS

The features and advantages of a test control circuit according to the present invention will be more clearly understood from the following description taken in conjunction with the accompanying drawings in which.

DESCRIPTION OF THE PREFERRED EMBODIMENTS

First Embodiment

Figure 1:
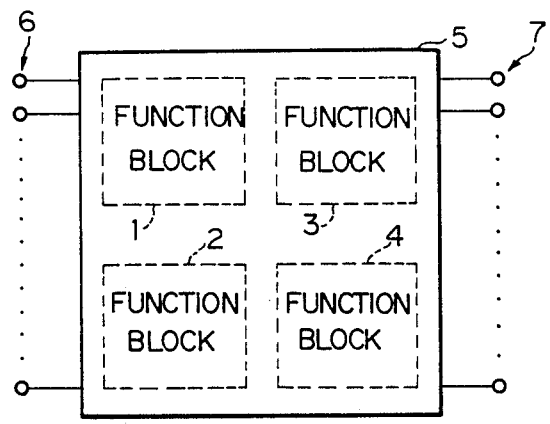
FIG. 1 is a plan view showing a very large-scale integration to which the present invention appertains.
Figure 2:
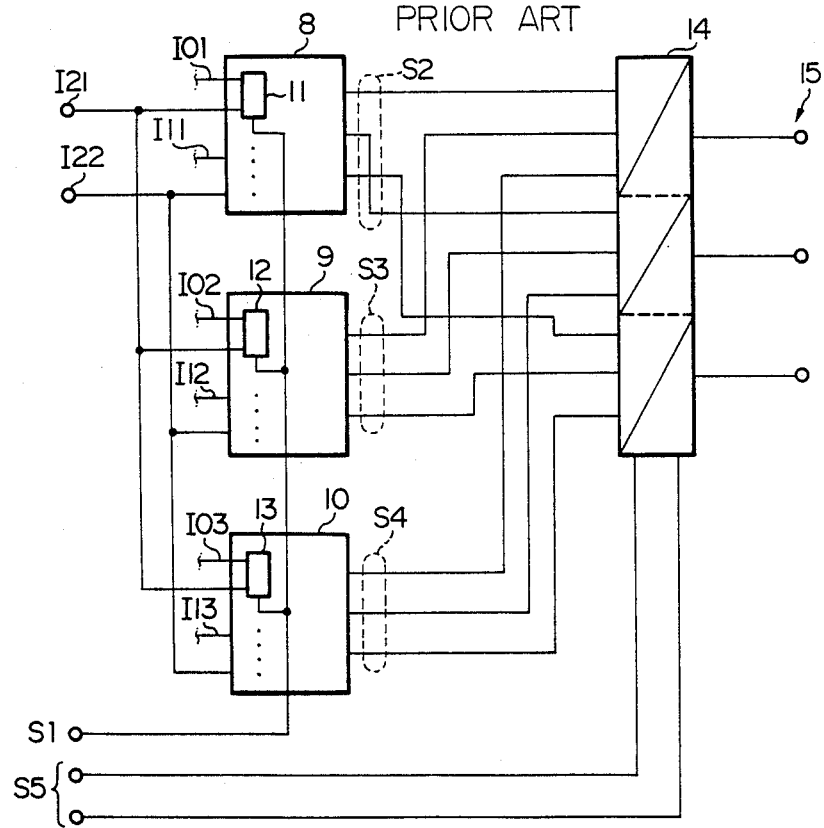
FIG. 2 is a block diagram showing the general arrangement of a typical example of a test control circuit.
Figure 3:
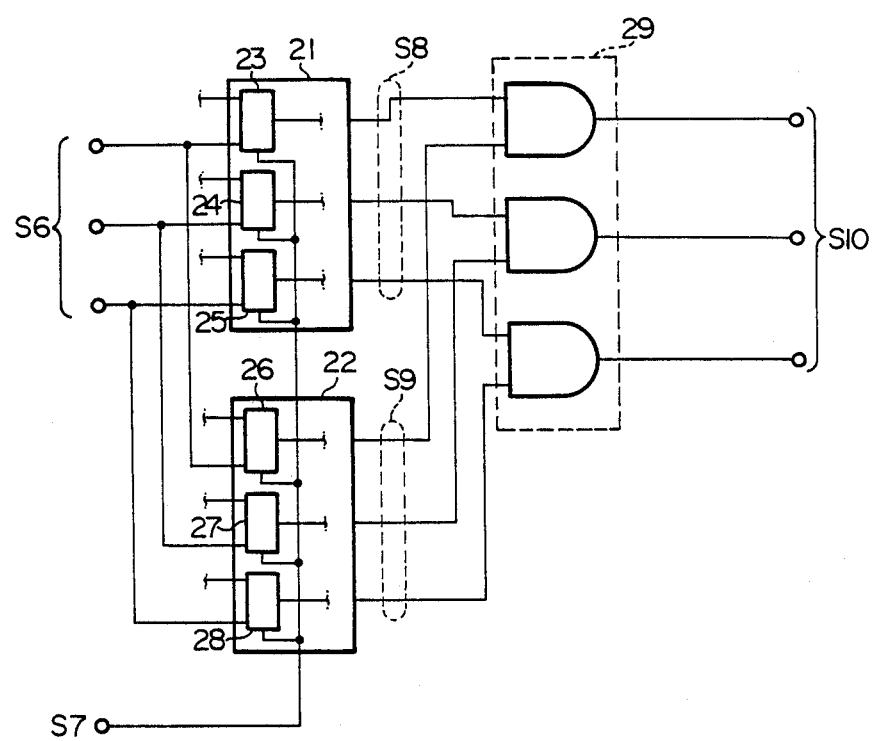
FIG. 3 is a block diagram showing the general arrangement of a test control circuit so as to solve the problems encountered in the prior-art test control circuit illustrated in FIG. 2.
Figure 4:
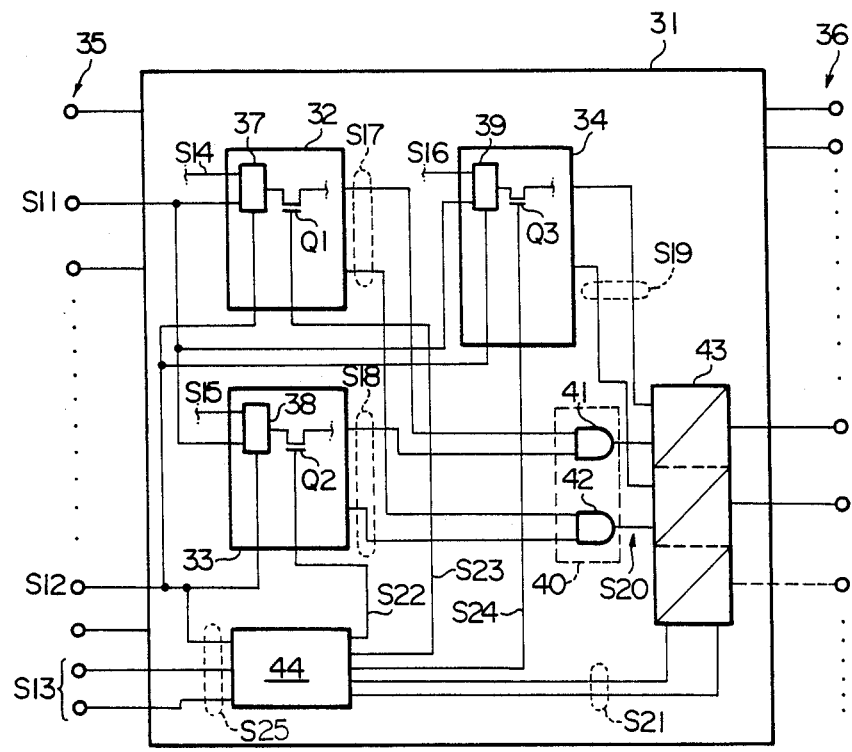
FIG. 4 is a block diagram showing the general arrangement of a test control circuit according to the present invention.

Referring to FIG. 4 of the drawings, there is shown the general arrangement of a test control circuit according to the present invention fabricated on a single semiconductor chip 31 together with component function blocks 32, 33 and 34. The component function blocks 32, 33 and 34 have respective functions identical with one another. The semiconductor chip 31 is provided with a group of input terminals 35 and a group of output terminals 36 and some of the input terminals 35 are supplied with a common test signal S11, a test mode signal S12 and control signal S13. In this instance, the test mode signal S12 and the control signal S13 form in combination a command signal S25.

The test control circuit illustrated in FIG. 4 comprises selector circuits 37, 38 and 39 and transfer gates Q1, Q2 and Q3 coupled to the selector circuits 37, 38 and 39 and associated with the component function blocks 32, 33 and 34, respectively. The selector circuits 37, 38 and 39 are responsive to the test mode signal S12 and transfer the common test signal S11 to the component function blocks 32, 33 and 34, respectively. However, the selector circuits 37, 38 and 39 respectively transfer data signals S14, S15 and S16 to the component function blocks 32, 33 and 34 in the absence of the test mode signal S12. When the common test signal S11 is applied to the component function blocks 32, 33 and 34, the component function blocks 32, 33 and 34 perform the respective operations and produce first, second and third output signals S17, S18 and S19 each consisting of first and second bits. The component function block 32 is identical in function with the component function block 33 so that the component function block 32 produces the first output signal S17 identical in bit string with the second output signal S18 in so far as the component function blocks 32 and 33 operate without any trouble therein.

The test control circuit illustrated in FIG. 4 further comprises a logic circuit 40 having two AND gates 41 and 42 and each of the AND gates 41 and 42 has two input nodes. The AND gate 41 is supplied with the first bits of the first and second output signals S17 and S18 and performs an AND operation for the first bits. On the other hand, the AND gate 42 is supplied with the second bits of the first and second output signals S17 and S18 and carries out an AND operation for the two second bits. Then, the logic circuit 40 produces an output signal S20 identical in bit string with the first and second output signals S17 and S18 and the output signal S20 of the logic circuit 40 is supplied to a selector circuit 43 together with the third output signal S19.

The selector circuit 43 is responsive to an output control signal S21 which is supplied from a control signal generating circuit 44. In this instance, the control signal generating circuit 44 is formed by a decoder circuit and produces three prohibiting signals S22, S23 and S24 as well as the output control signal S21 based on the command signal S25. The prohibiting signals S22, S23 and S24 are applied to the transfer gates Q1, Q2 and Q3, respectively, and cause the transfer gates Q1, Q2 and Q3 to turn off, respectively. When the transfer gates Q1, Q2 and Q3 are turned off, the component function blocks 32, 33 and 34 is isolated from the selector circuits 37, 38 and 39, respectively, then the component blocks 32, 33 and 34 does not produce the output signal S17, S18 and S19 based on the common test signal S11. In other words, the component function blocks 32, 33 and 34 suspends the productions of the first, second and third output signals S17, S18 and S19 based on the common test signal S11, respectively.

In operation, the test mode signal S12 is supplied to the selector circuits 37, 38 and 39, then the selector circuits 37, 38 and 39 transfer the common test signal S11 to the component function blocks 32, 33 and 34, respectively. In this stage, the control signal generating circuit 44 does not produce the prohibiting signals S22, S23 and S24, then, with the common test signal S11, the component function blocks 32, 33 and 34 produce the first, second and third output signals S17, S18 and S19 and the first output signal S17 is ANDed with the second output signal S18 by the logic circuit 40. The control signal generating circuit 44 produces the output control signal S21 which causes the selector circuit 43 to transfer the output signal S20 to the output terminals 36.

For detection of a trouble in the logic gate 40, the control signal generating circuit 44 is caused to produce the prohibiting signal S22 by changing the command signal S25. Then, the transfer gate Q2 turns off to cut off a signal propagation path from the selector circuit 38 to the component function block 33. This results in that the component function block 33 suspends the production of the second output signal S18 based on the common test signal S11 or changes the bit string of the second output signal S18. When the first output signal S17 is different in bit string from the second output signal S18, the logic circuit 40 changes the output signal S20. However, when the logic circuit 40 has a trouble, the logic circuit 40 does not change the bit string of the output signal S20, then the trouble is detected by comparing the output signal S20 with the previous output signal S20.

Second Embodiment

Figure 5:
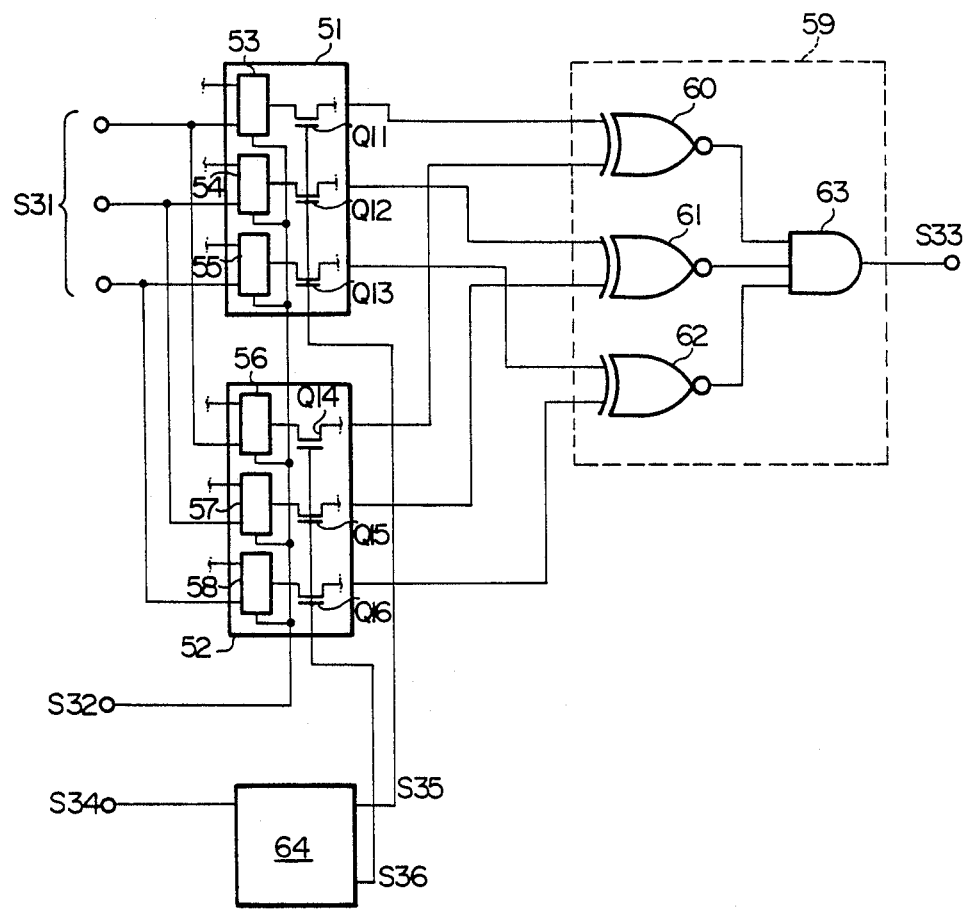
FIG. 5 is a block diagram showing the general arrangement of another test control circuit according to the present invention.

Turning to FIG. 5 of the drawings, the arrangement of another test control circuit is illustrated together with two component function blocks 51 and 52 operative to achieve functions identical with each other. The test control circuit illustrated in FIG. 5 comprises two groups of selector circuits 53 to 58 one of which is associated with the component function block 51 and the other of which is associated with the component function block 52. The selector circuits 53, 54 and 55 transfer a common test signal S31 consisting of three data bits to transfer gates Q11, Q12 and Q13 in the presence of a test mode signal S32 or a first data signal consisting of three data bits to the transfer gates Q11, Q12 and Q13 in the absence of the test mode signal S32. Similarly, the three selector circuits 56, 57 and 58 transfer the common test signal S31 to transfer gates Q14, Q15 and Q16 in the presence of the test mode signal S32 or a second data signal to the transfer gates Q14, Q15 and Q16 in the absence of the test mode signal S32. The component function blocks 51 and 52 produce respective output signals each consisting of first, second and third data bits based on the first and second data signals or the common test signal S31 depending upon the test mode signal S32.

The test control circuit further comprises a logic circuit 59 which has three exclusive-NOR gates 60, 61 and 62 and an AND gate 63. The first data bits of the output signals produced by the component function blocks 51 and 52 are applied to the exclusive-NOR gate 60 which performs an exclusive-NOR operation for the first data bits to produce an output signal. Namely, when the first data bits are logic "1" levels or logic "0" levels, the exclusive-NOR gate 60 produces the output signal of logic "1" level. However, when the first data bits are different in logic level from each other, the exclusive-NQR gate 60 produces the output signal of logic "0". Thus, the exclusive-NOR gate 60 is capable of detecting whether or not the two first data bits are identical in logic level with each other. Similarly, the exclusive-NOR gate 61 performs an exclusive-NOR operation for the second data bits of the output signals produced by the component function blocks 51 and 52 and produces an output signal representing the agreement or disagreement between the second data bits. The exclusive-NOR gate 62 also performs an exclusive-NOR operation for the third data bits and produces an output signal representing the agreement or disagreement between the third data bits. The respective output signals produced by the exclusive-NOR gates 60, 61 and 62 are ANDed by the AND gate 63 so that the AND gate 63 produces an output signal S33 of logic "1" level when all of the data bits of the output signal produced by the component function block 51 agree with the corresponding data bits of the output signal produced by the component function block 52. However, the AND gate 63 produces the output signal S33 of logic "0" when at least one pair of data bits are different in logic level. Thus, the logic circuit 59 produces the output signal S33 representing the agreement or disagreement between the output signals supplied from the component function blocks 51 and 52.

The test control circuit illustrated in FIG. 5 further comprises a control signal generating circuit 64 which is responsive to a command signal S34 and capable of producing a first or second prohibiting signal S35 or S36. The first prohibiting signal S35 is commonly applied to the transfer gates Q11, Q12 and Q13 so that signal propagation paths between the selector circuits 53 to 55 and the component function block 51 are blocked in the presence of the first prohibiting signal S35. On the other hands, signal propagation paths between the selector circuits 56 to 58 and the component function block 52 are blocked in the presence of the second prohibiting signal S36.

The test control circuit thus arranged is operative to concurrently examine the component function blocks 51 and 52. Further, the control circuit illustrated in FIG. 5 can detect a trouble in the logic circuit 59 by using the first or second prohibiting signal S35 or S36.

If the control signal generating circuit 64 produces the first and second prohibiting signals S35 and S36 partially overlapping each other, the component function blocks 51 and 52 are successively activated after a short interval and produce the respective output signals which are supplied to the logic circuit 59. If the component function blocks 51 and 52 have respective troubles identical with each other, the output signals produced by the component function blocks 51 and 52 are different in bit string from an expected result. Then, the logic circuit 59 produces the output signal S33 which has a waveform different from an expected waveform based on the output signals supplied from the component function blocks 51 and 52 each operating without any trouble. Thus, the test control circuit illustrated in FIG. 5 is capable of detecting troubles in the component function blocks 51 and 52.

Although particular embodiment of the present invention have been shown and described, it will be obvious to those skilled in the art that various changes and modifications may be made without departing from the spirit and scope of the present invention.

What is claimed is:

1. A test control circuit for an integrated circuit having a plurality of component blocks including at least two component blocks responsive to respective data signals or a common test signal and achieving predetermined functions, respectively, to produce respective output signals based on the respective data signals or the common test signal, said predetermined functions being identical with one another, comprising:

(a) a control signal generating circuit responsive to a command signal and capable of producing at least two prohibiting signals applied to said at least two component blocks, respectively;

(b) mode selecting means responsive to a test mode signal and causing said at least two component blocks to concurrently respond to said common test signal in the absence of said prohibiting signals; and (c) a logic circuit carrying out a logical operation for the output signals supplied from said at least two component blocks and producing an output signal, wherein each of said at least two component blocks suspends the production of said output signal based on said common test signal in the presence of said prohibiting signal.

2. A test control circuit as set forth in claim 1, in which said logic circuit carries out an AND operation for the respective output signals supplied from said at least two component blocks.

3. A test control circuit as set forth in claim 1, in which said control signal generating circuit further produces an output control signal and in which said test control circuit further comprises a selector circuit supplied with respective output signals of said component blocks and the output signal of said logic circuit and responsive to said output controlling signal for transferring one of said output signals to output means.

4. A test control circuit as set forth in claim 1, in which the output signal of each of said at least two component blocks consists of a plurality of data bits and in which said logic circuit comprises a plurality of AND gates equal in number to the data bits, wherein each of said AND gates has input nodes equal in number to said at least two component blocks and supplied with the data bits each fed from each of said at least two component blocks.

5. A control circuit as set forth in claim 1, in which the output signal of each of said at least two component blocks consists of a plurality of data bits and in which said logic circuit comprises a plurality of exclusive-NOR gates equal in number to the data bits and an AND gate having input nodes connected to respective output nodes of the exclusive-NOR gates, wherein each of said exclusive-NOR gates has a plurality of input nodes equal in number to said at least two component blocks and supplied with the data bits each fed from each of said at least two component blocks.

6. A test control circuit for an integrated circuit having a plurality of component blocks including at least two component blocks responsive to respective data signals or a common test signal and achieving predetermined functions, respectively, to produce respective output signals based on the respective data signals or the common test signal, said predetermined functions being identical with one another, said test control circuit being capable of carrying out a test mode of operation in accordance with a circuit partial method for concurrently testing said at least two component blocks, comprising:

(a) a control signal generating circuit responsive to a command signal and capable of producing at least two prohibiting signals applied to said at least two component blocks, respectively, said control signal generating circuit further producing an output control signal;

(b) mode selecting means responsive to a test mode signal and causing said test control circuit to be shifted in said test mode of operation in the absence of said prohibiting signals;

(c) a logic circuit carrying out a logical operation for the output signals supplied from said at least two component blocks and producing an output signal; and (d) a selector circuit supplied with the respective output signals of said component blocks and the output signal of said logic circuit and responsive to said output control signal for transferring one of said output signals to output means, wherein each of said at least two component blocks suspends the production of said output signal based on said common test signal in the presence of said prohibiting signal.

* * * * *